United States Patent [19]

Quaintance et al.

[11] 3,953,625
[45] Apr. 27, 1976

[54] PROCESS FOR MAKING INDICIA BEARING ANODIZED ARTICLE

[75] Inventors: Harold J. Quaintance, Fairview Park; Eugene Wainer, Shaker Hts., both of Ohio

[73] Assignee: Horizons Incorporated, Cleveland, Ohio

[22] Filed: July 13, 1973

[21] Appl. No.: 378,849

Related U.S. Application Data

[62] Division of Ser. No. 205,493, Dec. 7, 1971, Pat. No. 3,765,994.

[52] U.S. Cl. ............................ 427/258; 427/287; 427/304; 427/305; 427/405; 427/409
[51] Int. Cl.² ........................................... B05D 1/00
[58] Field of Search ........... 117/37 R, 41, 45, 71 M, 117/75, 130 E, 131, 211, 212, 216, 217, 218; 161/1, 6, 213, 214, 216; 96/84, 94; 156/247, 248; 148/6.1, 6.27; 204/79, 93, 23, 148; 427/58, 123–126, 162, 164, 258, 287, 304, 305, 404–407, 409; 428/29, 195, 201–209, 457, 458, 461

[56] References Cited
UNITED STATES PATENTS

| | | | |
|---|---|---|---|
| 2,662,034 | 12/1953 | Mason et al. | 148/6.27 X |
| 2,766,119 | 10/1956 | Freedman et al. | 96/86 |
| 2,995,443 | 8/1961 | Kempe | 117/45 X |
| 3,016,293 | 1/1962 | Cybriwsky et al. | 117/37 R X |
| 3,017,285 | 1/1962 | Wainer | 117/45 X |
| 3,216,866 | 11/1965 | Orlin | 148/6.1 |
| 3,220,903 | 11/1965 | Mandansky | 161/6 X |
| 3,340,164 | 9/1967 | Zimmerman | 117/75 X |
| 3,573,948 | 4/1971 | Tarnopol | 117/5.5 |
| 3,627,619 | 12/1971 | Fromm | 161/3.5 |
| 3,694,945 | 10/1972 | Detiker | 161/6 X |
| 3,715,211 | 2/1973 | Quaintance | 117/45 X |

OTHER PUBLICATIONS

Warnick and Pinner, *Surface Treatment and Finishing of Aluminum and its Alloys*, Robert Draper Ltd., England, 1956, pp. 374–375.

*Primary Examiner*—Thomas J. Herbert, Jr.
*Assistant Examiner*—Bruce H. Hess
*Attorney, Agent, or Firm*—Lawrence I. Field

[57] ABSTRACT

The production and use of indicia-bearing anodized layers from which the backing metal has been removed as transparent or translucent elements in articles in which the layer may be laminated to a clear or translucent layer so that the information contained in the anodized layer can be read by direct illumination rather than by reflected light.

The information in the pores of this anodized article is preferably in the form of a metal image and of a metal selected from the group consisting of silver, gold, platinum and palladium which is preferably silver and which may be intensified by the electroless deposition of other metals thereon, such metals being selected from the group consisting of nickel, cobalt, iron, copper, chromium, gold, silver, platinum, palladium and mixtures thereof.

Products of special interest include edge lighted panels, microfilm, microfiche, photomasks, and printed circuits.

13 Claims, 22 Drawing Figures

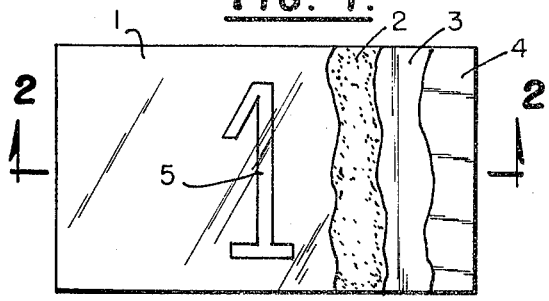
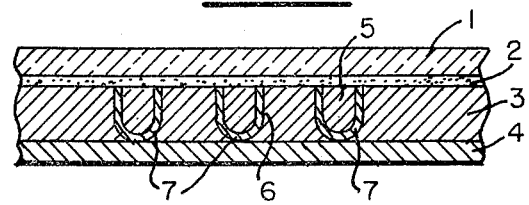
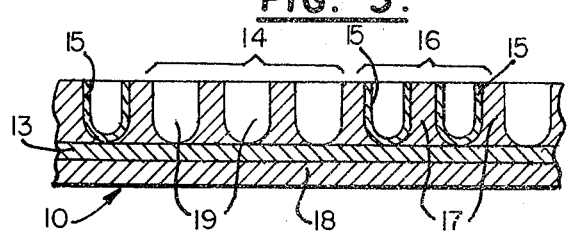
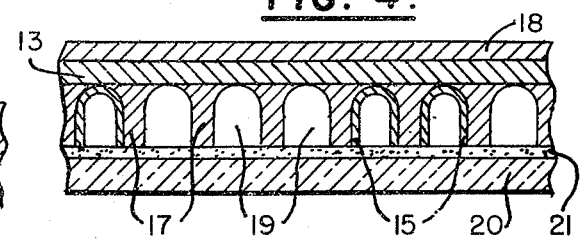
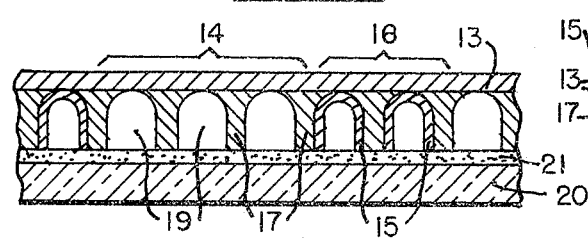
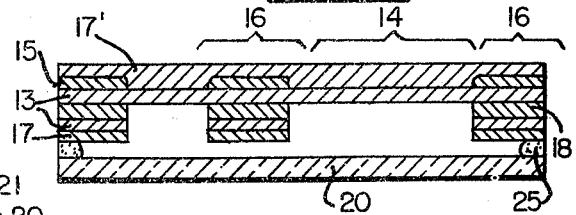
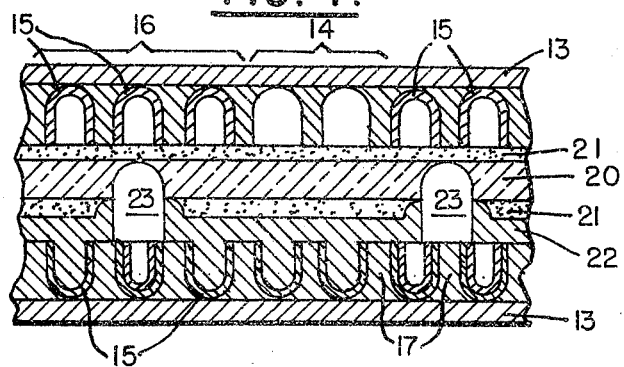
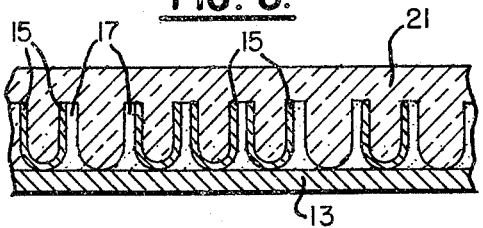
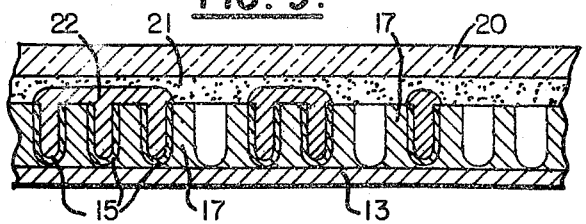
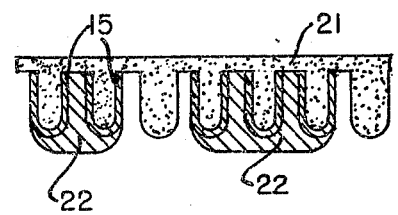

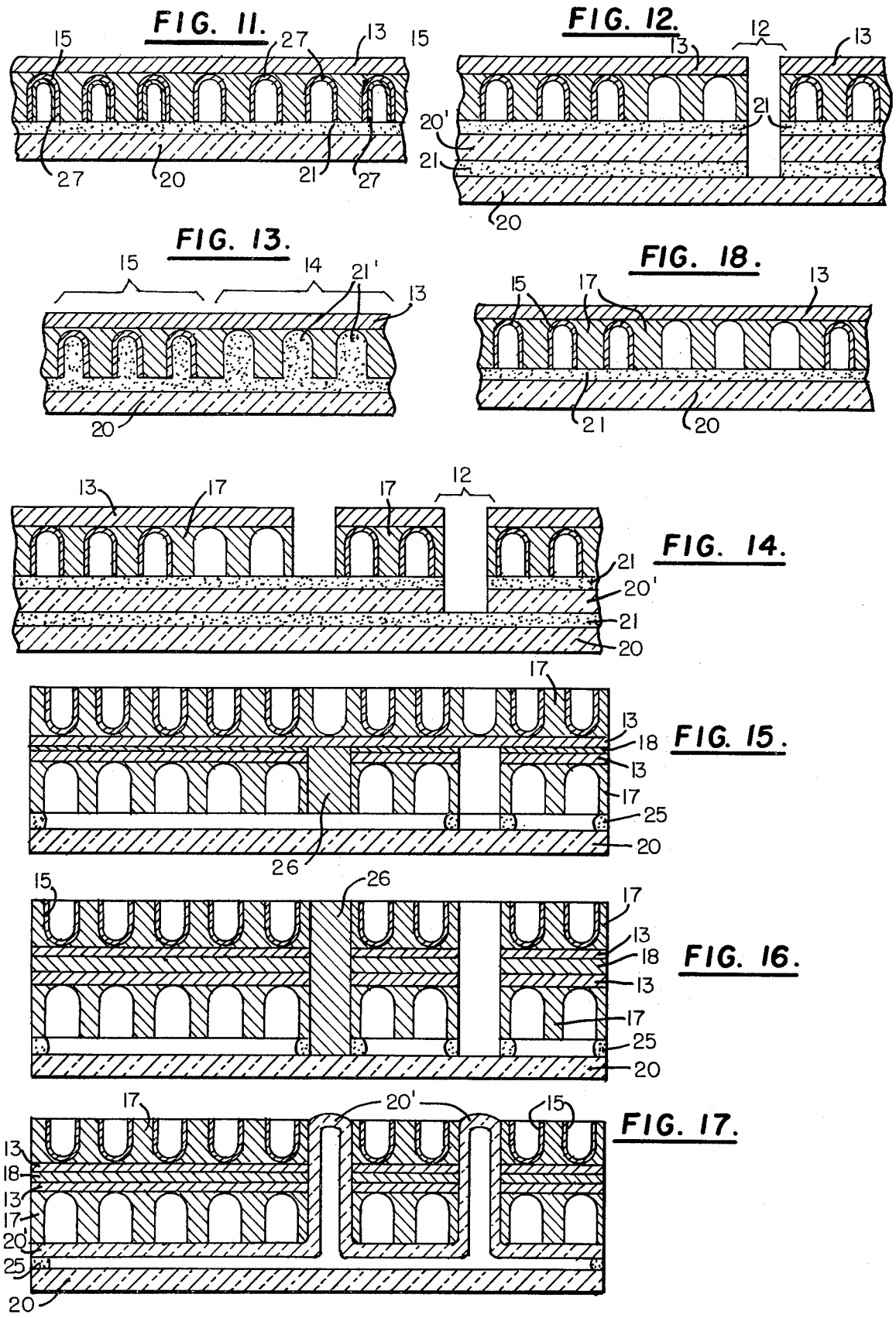

PROCESS FOR MAKING INDICIA BEARING ANODIZED ARTICLE

This is a division of application Ser. No. 205,493 filed Dec. 7, 1971, now U.S. Pat. No. 3,765,994.

The use of anodized aluminum in the production of highly durable articles is well known. Such articles when properly treated exhibit extremely durable properties, making them suitable for such objects as residential siding, various trim or molding components for automobiles, and in an extreme example have been successfully employed as cylinder walls in the internal combustion engine.

Because of this durability characteristic when properly treated (sealed) together with a characteristic microporous nature in the unsealed state, use has been made of anodized aluminum in the commercial production of highly durable, abrasion resistant, reflective photographically imaged articles composed of silver such as defined in U.S. Pat. No. 2,766,119 or in conjunction with a resist material as described in U.S. Pat. No. 3,079,309 disclosing images consisting of various colorants or dyestuffs within the porous anodized layer for the production of nameplates identification badges, dial panels, and a variety of other highly durable objects which are suitable for use in extremely harsh environmental conditions for relatively long periods of time, especially when the photographic-silver images are toned with gold and then sealed by any of the known methods for sealing anodized aluminum such as referred to in U.S. Pat. No. 3,715,211 issued Feb. 6, 1973.

All of the known heretofore uses and techniques employing imaging within the anodized layers are limited by the fact that the various objects produced are necessarily viewed with reflected light since the anodized layer is supported by the aluminum metal backing member from which the anodized layer was produced and lends support to the anodized layer as well as acting as a light scattering medium which enhances the metallic vitreous effect characteristics of such anodized layers.

It is also know to those familiar in the production of anodized aluminum articles and well described in "The Surface Treatment and Finishing of Aluminium and its Alloys" by S. Wernick and R. Pinner that the anodized structure consists of micropores which extend vertically toward the aluminum backing member, separated therefrom by a thickness of anodized aluminum, commonly referred to as a "barrier layer" which is integral with the aluminum backing member. When such an anodized layer is removed from the aluminum backing member and viewed under high powers of magnification e.g. by the use of an electron microscope, this barrier layer can be seen to consist of a continuous coherent layer of nonporous anodized aluminum which is similar in every respect to a sealed anodized layer being characterized by extremely good abrasion and chemical resistance, weatherability characteristics, and refusal to accept a dye or stain. Thus the anodized layer when removed from the aluminum backing member and reversed, the barrier layer now facing the viewer as the surface layer, is in every respect both chemically and physically equivalent to a sealed anodized layer as normally obtained, by sealing the porous anodized layer in the usual way. Further, if an anodized aluminum article preferably in the unsealed state (porous) is first coated with a cross-linkable monomer or a thermosetting polymeric material, or a pressure sensitive thermosetting or thermoplastic composition such that when suitable energy in form of light, heat, or pressure or any combination thereof is supplied, a polymeric coating is obtained which preferably penetrates the porous anodized layer and bonds to the same so that a sealed nonporous layer throughout said structure is assured.

By the use of known solvents which exert a solvent action on the aluminum metal backing member only and which have little or no solvent action on the anodized aluminum oxide layer, the backing member of the above polymer treated article can be removed—resulting in an article which has all the durability characteristics of a sealed anodized aluminum article and which, in addition, can be viewed by transmitted light.

It is therefore the principal object of this invention to provide novel products and methods, by which highly durable dimensionally stable films or transparencies or other articles can be made which have many uses and advantages heretofore unattainable and which form the various objects and embodiments of this invention.

One specific object of this invention relates to the use of such novel highly durable films in the manufacture of edge illuminated panels, particularly to the production of such films which form that portion of such panels known as the "indicia" panel, resulting in a novel product of high utility.

Another object of this invention pertains to the use of such novel highly durable transparent films in the production of microimaging known as microfiche, with the advantage of great dimensional stability in changing ambient conditions.

A further object of this invention pertains to the use of such novel highly durable transparent films in the manufacture of photomasks, again resulting in remarkable dimensional stability in varying ambient conditions.

The fourth object of this invention pertains to the use of such novel highly durable electrically insulating films as the basis for the production of printed circuits.

The fifth object of this invention pertains to the use of such novel highly durable transparent films in the manufacture of lighted displays for information or advertising purposes.

The sixth object of this invention pertains to the use of "electroless" plating techniques or imagewise increase of diffuse transmission density of developed out and fixed silver images embedded in an anodized layer on aluminum.

Edge illuminated panels generally comprise a clear transparent sheet of glass or plastic such as acrylic or methyl methacrylate resin upon one surface which contains white translucent indicia outlined by an opaque black field. The means of illumination are generally provided by miniature tungsten bulbs or by light emitting diodes which direct light indiscriminately through the panel being reflected from the opaque surface while illuminating those areas consisting of the white translucent material which generally defines the indicia. A variety of methods are available for directing light efficiently throughout the panel since it is in most instances essential that instruments or dials be viewed at night. It is recognized that "dark adaptation", i.e. the maximum ability to see in the dark before or after being exposed to strong ambient light, is desirable in some instances and that red light does not materially alter this adaptation phenomenon, hence the illuminating source on many dials and instruments aboard ships and aircraft will employ red colored illuminating sources and therefore must be highly efficient since these are placed within or at the edges of the light transmitting panel. So that no glare is given off from the surface of such panels and to provide maximum contrast when viewed with ambient external light, the indicia generally consist of flat white translucent material and the remainder of the panel a flat black opaque background coating, together which comprise the indicia panel which is generally the most complex portion of the system and expensive to fabricate.

Conventional edge illuminated systems generally utilize optically flat, polished, transparent surfaces; one of which contains the indicia panel laminated to the light transmitting panel and the other or reverse side of which may be covered by the opaque black field to conserve light energy. The indicia comprising the indicia panel may be etched, painted, printed or engraved.

In order to eliminate difficulties caused by refracted images of the illuminating source and parallax when the overall size of the panel is restricted, a duo-panel system has been utilized wherein the indicia panel is separated from the light transmitting panel by a small air space which provides poor optical contact between two panels. In this method suitable support of the indicia panel without optically contacting the transparent element is difficult at best.

A high ratio between daylight reflectivity of the exposed indicia and the transmission of internal light compared to the opaque black outline may be achieved by use of embossed or raised graduations of the indicia formed in the light transmitting panel to which a translucent white lacquer is applied, followed by a second thin lamination of opaque black lacquer at the base and surrounding areas, leaving the white raised portions free of opaque.

In direct contradiction to the principle of providing poor optical contact between the indicia-bearing panel and the light-transmitting panel, a concept may be employed whereby polished metallic surfaces are optically bonded to the surfaces of an edge illuminable panel and light is transmitted by reflection between the polished reflective boundaries which may be composed of polished metal foil, sheets, evaporated metal films or the like. A translucent, white coating is then laminated over the foil while an opaque, black coating is applied to the translucent coating. To provide openings in the foil for the indicia or markings, the foil laminated transparent panel can be coated with a photoresist and metal selectively removed. Alternately, the patterned openings may be filled with a translucent material or insert and the remaining area blackened by chemical means or by painting.

In another mode the indicia panel may be formed with printed circuits or other conductors for carrying electrical current to the lamps whereby the circuits are pressed flush into the top and bottom surfaces of the indicia panel, using heat and pressure. In a second procedure, the electric circuits are formed by two non-connected wire mesh laminations embedded in the top and bottom surfaces of the indicia panel or alternately the electrical circuits are pressed flush into only the bottom surface of the indicia panel, forming a separate line pattern.

In yet a further modification, the light-transmitting panel may be completely coated with a white translucent coating followed by an opaque flat black lamination. The black opaque coating may then be scribed or mitered out, exposing the white translucent layer thereby forming the indicia, providing both laminations are carefully controlled with regard to thickness, both surfaces of the light-transmitting panel being perfectly flat and parallel.

In order to obtain a polychromatic edge illuminated system, the indicia may be formed with an inlaid mosaic of colored glass or plastic spelling words while the light-transmitting panel contains miniature lamps of various colors or enclosed in various colored filters; the number depending on the number of colors or words desired. As the various colored lamps are selectively energized, any word or color in the indicia panel corresponding to that color will be lighted; whereas, colors complimentary to that color will effectively prohibit light. In this manner a multicolor system may effectively be displayed, depending on the number of different colored filters or lamps and color-forming indicia employed. The multicolor indicia panel may have a translucent or ground surface or be assembled behind a neutral filter sheet to avoid ambiguity in strong ambient light. The colored mosaics may also be fabricated by a colored transparency. Alternately, instead of mosaics, sheet filters of the desired color are inserted between the light conducting and the indicia panel or the indicia panel may be fabricated from a number of different colored plastic sheets, each of which contain the indicia cut or engraved into each sheet.

As stated hereinbefore, an object of this invention pertains to the manufacture of illuminable control panels, referred to hereinafter as edge illuminated panels, particularly a method is provided which greatly simplifies such manufacture and decreases significantly the cost of manufacture of such panels and provides a more durable panel than obtainable heretofore by other known methods, particularly as they relate to that portion of such panels commonly referred to as the indicia panel. More particularly, this object pertains to the use of a photosensitive anodized aluminum or otherwise imaged anodized aluminum for the production of the indicia panel of edge illuminated devices.

In the use of microimage transparencies, known generally as "microfiche" which has gained wide acceptance in mass information storage retrieval systems, it is well known that such systems suffer in the case of gelatin-silver halide systems to the extent that archival storage of such films for long periods of time are prone to degradation by moisture, excess heat, contaminants in the surrounding atmosphere, bacteria or mold attack, and a variety of other problems unless special precautions for the storage and protection of such films are resorted to. Other systems such as "Diazo" films may be utilized but generally these systems are in one way or another inferior to the silver halide-gelatin system. In addition, such films irrespective of the materials used, on normal handling during use are subject to scratches, fingerprints, etc. which in some cases may obliterate the image unless special precautions are resorted to. Neither of these systems exhibit good dimensional stability under varying ambient conditions. Therefore, a specific object of this invention is to provide a highly durable dimensionally stable microfiche imaging system which is not subject to any of the above mentioned defects or prone to degradation or attack in the most severe cases of extreme exposure or handling.

Use is commonly made of silver halide-gelatin systems for photomasks which are used as the "negative" for contact printing on photoresist materials for use in the printed circuit industry, for example, and as resolution targets on various photosensitive substrates and a variety of other purposes. In many cases where extremely high density images are a necessary part of the photomask, the silver halide-gelatin system will not suffice and especially where the photomask is subject to rough handling and physical abuse. Such photomasks are not dimensionally stable under varying ambient conditions. In such cases evaporated metal films coated onto a transparent substrate, such as glass or etched metallic patterns may be resorted to but such articles are expensive and relatively time consuming to produce and are subject to generally rather poor resolution capabilities.

It is therefore a further object of this invention to provide a method for the production of highly durable dimensionally stable and novel photomasks which are produced efficiently both from a cost/time standpoint and have high resolution capabilities as well as a high ratio of density to transmission of light in the image-nonimage area.

The fourth object of this invention pertains to the use of such novel highly durable, dimensionally stable, electrically insulating films, as the basis for the production of printed circuits, in which not only a higher resolution capability with respect to conductor width and/or conductor spacings exists compared to that obtained by conventional "resist" techniques but the substrate thickness and uniformity as well as surface smoothness is much easier to control and obtained to a degree higher than that obtainable by other known methods.

The fifth object of this invention pertains to the use of such transparent anodized layers containing an overall image which consists of various dyes and/or silver dye images and/or silver toned images which may be utilized in the production of color transparencies which are more durable than that obtainable heretofore by other known methods for producing such; and by virtue of this improved durability render such films, particularly suitable for lighted transparent outdoor information displays.

A sixth object of this invention is a method of increasing the diffuse transmission density of silver images embedded in an anodized layer of aluminum by a specific application of metal only to silver containing portions of the layer by the technique of "electroless" deposition of various metals, particularly nickel.

These and other objects will be pointed out or will be apparent from the description which follows.

As stated hereinbefore the main object of this invention is to provide a novel method leading to novel products to increase the utility and broaden the scope of the use of the anodized layer provided by anodized aluminum both by virtue of the microporous structure and extreme durability of the anodized layer. For example, various military and commercial electronic equipment require that certain graphic information displays be extremely durable as well as easily fabricated with a view toward the economic production of such which implies that a low rejection rate of such articles be achieved or at least that the rejection may be defined at an early stage of the production, prior to the investment of considerable material, time and effort in the fabrication of such devices. With the subject invention it is possible to achieve all these goals in a variety of methods; the subject of which forms a part of the various following embodiments.

In one simplified embodiment of the invention, the indicia panel of an edge illuminated panel is formed of a fully developed or reduced silver image embedded within the porous structure of the anodized layer which forms the opaque, flat black background area, which in turn outline the indicia which are composed of of the anodized layer which is devoid of reduced silver and hence form the translucent indicia. In this embodiment a photosensitive anodized aluminum plate is exposed through and in contact with a suitable negative which defines in reverse the indicia desired, said latent imaged photosensitive anodized aluminum plate being subsequently developed and fixed in the normal photographic mode, laminated face down to a sheet of light-transmitting glass or plastic and the aluminum metal backing member removed by etching, resulting in a highly durable indicia panel—light transmitting panel combination, the indicia panel composed of the silver image embedded and sealed within the anodized structure.

Alternately, suitable sheet filters consisting of various colors or of a translucent nature may be inserted or laminated between the anodized indicia layer and a light-transmitting panel.

In another adaptation of this embodiment, the laminating material may itself consist of white or various colors of a translucent nature. Alternately, mechanically roughening of the surface of the light-transmitting panel to enhance the translucent nature of the overall panel, providing the laminating material is not a solvent for the light-transmitting panel, may be utilized. In addition, selected areas of the anodized indicia panel can be mechanically or chemically removed to provide for the unrestricted passage of light, uninhibited by either opaque or translucent areas for the illumination of dials or pointers mounted above the face of the panel, for example.

In a second embodiment of the invention, in order to provide for a separation of a small distance between the indicia panel and the light-transmitting panel use is made of an imaged anodized aluminum plate which is in this case right reading and which is rigid due to a heavier gauge and upon which a photographic image of the indicia is outlined by the developed black silver background. After sealing the pores of the anodized aluminum by any of the conventional known methods, a resist material is applied to the reverse surface of the plate and exposed, for example, through the same negative as used to photographically contact print the indicia on the obverse and held in registry thereto. The aluminum backing member is selectively removed by etching in the nonimage area directly behind the indicia or translucent portions of the indicia panel and thus can then be easily mounted at the edge or nontranslucent areas. Alternately, the indicia portions consisting of the nonsilver containing anodized layer can be removed and translucent plastic indicia inserted in the panel.

In another mode the above etched indicia panel may be placed face down on a flat object and the voids or openings may be filled with a translucent clear or colored material for example, with the indicia-bearing anodized layer forming the base of the void or indicia. In place of the translucent material inserted in the reverse etched portions, the panel may instead be laminated to a translucent panel on the reverse anodized aluminum indicia panel or laminated directly to a light-transmitting panel having on its surface raised indicia identical to the openings formed in the above described indicia panel. If a highly specular reflective backing is required, the reverse of the above indicia panel can easily be polished after etching. Additionally a thin light-transmitting metal backing may be applied by evaporation, for instance.

In another embodiment of the invention metallic conducting strips for the purpose of providing for the transmission of electrical current from a source exterior to a panel to a miniature electrical lamp or lamps, photodiodes or the like, located within the panel may be easily obtained by a process which is referred to as "electroless deposition". This process which is described more fully in a volume entitled "Metal Coating of Plastics" by Dr. E. A. Lowenheim,* can be utilized to electrolessly deposit various metals such as copper, nickel, cobalt and the like within and above the pores of the anodized aluminum layer to form a continuous electrically conducting path providing the anodized layer is first sensitized with a metal more noble than the metal to be electrolessly plated and catalytically able to reduce such anodized aluminum in the presence of suitable reducing agents. Metallic silver, among other such noble metals as gold, platinum, and palladium, is capable of catalytically depositing, under the proper conditions, conductor metals such as copper, nickel, cobalt and the like. Therefore, the developed silver image can be made conductive either in specific areas or in the total area containing the catalytic silver image by simple immersion in the requisite electroless plating solution.

* Published by: Noyes Data Corporation

In a further embodiment of the invention, a polychromatic indicia panel display may be obtained by application of any dye which will penetrate the pores of the anodized aluminum layer after the silver image has been developed and fixed, leaving the indicia numerals or letters translucent e.g. by hand painting, dipping, or in conjunction with a photoresist. Since the silver image (developed) is originally at the base of the pores, colored dyes and stains may be easily applied to the porous translucent nonimage area since the developed black silver image will effectively mask the dye color if applied in those areas. After the anodized layer is treated as above, the plate then is laminated to the light-transmitting panel face down and the aluminum backing member removed by etching.

The same effect may be accomplished without use of the silver image by either utilizing a series of colored dyes and/or a black dye, all of which may be applied by use of a photoresist, offset printing, silk screening, or any other means known for transferring an image used by the graphic arts industry.

Alternately, use of a combination of two or more dyes preferably in particle form may be impregnated in the translucent indicia portion and laminated face down to the light-transmitting panel and the aluminum backing removed. By then exposing selected portions of the indicia to light of a certain color, any word or color in the indica panel corresponding to that color will be lighted; whereas words or colors complimentary to that color will effectively prohibit light.

Alternately, very thin colored sheet filters which are commercially available may be applied between the imaged anodized indicia panel and the light-transmitting panel in preselected areas.

The second object pertaining to the production of these novel highly durable imaged anodized films suitable for microimaging can be achieved by any of the previously mentioned techniques described for the production of the edge illuminated indicia panel. Since the porous structure of the anodized layer may contain up to $498 \times 10^9$ pores per square inch, the degree of resolution obtainable, assuming the silver halide grains reside solely in the individual pores of the layer as opposed to a surface coating of silver halide, may be of the order of the film porosity hence the resolution capability may extend even beyond that required for microfiche into the ultra-microfiche domain and theoretically even beyond the maximum resolution capability of visible light. The image may be obtained by conventional photographic reduction techniques or by direct contact printing of a negative previously reduced to scale (microfiche or ultramicrofiche cards). In order to increase the density of the high resolution anodized image, conventional silver image intensifiers may be resorted to or alternately, as mentioned hereinbefore, the silver image may be intensified by the electroless deposition of nickel, for example, which in the early stages of such deposition results in a very dense black image superimposed on the silver within the anodized porous structure. This process of intensifying such silver images is novel and is claimed in our copending application Ser. No. 191,635 filed on Oct. 22, 1971 in the United States Patent Office the disclosure of which is incorporated herein by reference. By laminating face down the above treated imaged, anodized aluminum plate with a clear light transmitting binder to a glass plate or clear plastic substrate and removing the aluminum backing member, a unique, highly durable microimage is available which is embedded in the porous anodized structure and which is not subject to any of the aforementioned defects or prone to attack or degradation in even the most extreme cases of exposure or handling compared to conventional microimaging systems.

In another object of this invention, the unique transparent anodized image may be employed in the production of high resolution, highly durable novel photomasks which may have a high density ratio on the image vs nonimage area for the transmission of light and exhibit excellent dimensional stability under varying ambient conditions. The same techniques used for the production of photomasks except the electroless deposition of the metals deposited on the silver image enclosed in the anodized porous structure may be continued to the point where a electroless metallic deposit may actually form a metal bridge over the pores.

Another object of this invention therefore pertains to the production of the bridged electrolessly deposited metal pattern which forms the basis for the production of a novel printed circuit wherein a suitably conductive metal is electrolessly deposited upon the embedded silver image to such an extent that the deposited metal bridges over the silver image in the anodized layer to provide a continuous electrical path between two or more contacts. By laminating the resulting plate face down to a supportive substrate for example, external contact to the enclosed circuit pattern can easily be made by insertion of any type of conductive contact pin to achieve electrical continuity between external contacts and the visibly enclosed circuit pattern. Additionally, a multiplicity of such films may be laminated in a layered structure thereby providing a high density packing arrangement of electrical patterns which may be connected to one another by insertion of contact pins to various depths throughout the multiple layered arrangement.

In this manner a highly durable enclosed circuit pattern possessing extremely high resolution capability of conductive paths as well as extremely thin, smooth substrate films is obtainable.

In a further embodiment, such films may be utilized in conjunction with the diffusion into such films of certain semiconductor materials by liquid or evaporation diffusion techniques.

In the practice of this invention, the anodized layer is produced by anodizing procedures well known in the art. The anodized layer on the aluminum panel is preferably 15 microns in thickness, although anodized layers from 1 to 50 microns in thickness have been used. With thicker anodized layers, for example from 50 to 100 microns thick, sufficient cohesive strength is obtained to the extent that an additional supporting layer may not be needed.

The adhesive resins or laminates utilized will, of course, vary depending upon the specific materials to be laminated to the anodized layer. Among the adhesives which have been effectively utilized either alone or in various combinations to cohesively bond to aluminum oxide films but not necessarily limited thereto are alkyds, vinyls, acrylics and epoxy resins. Epoxy resins are especially useful in this respect since they may be cured over a wide temperature range, depending on the curing agent employed and may be formulated as a single component or two component system and are amenable to a wide range of colored filler material additions. Phenolic resins, modified by the addition of various rubbers, vinyls, or epoxy resins, can also be utilized. Synthetic rubbers used with phenolic resins are based chiefly on (1) chloroprene to give neoprene rubber and (2) butadiene plus acrylonitrile to give nitrile rubber (Buna-N). Vinyl components are typified by the phenolic-polyvinyl butyral type. Polyethylene resins may also be utilized. Excellent adhesion can be obtained of aluminum oxide films to acrylic films or sheets with resorcinol-formaldehyde adhesives. Polyurethane adhesives may be utilized to bond acrylics to aluminum, especially when the aluminum surface is first primed with a polysulfide epoxy. Unsaturated polyester-styrene adhesives may also be utilized. Among other adhesives used for a variety of other types of plastics films are included: cellulose nitrate, alkyl cyanoacrylates, furanes, GRS-rubber-based (solvent types), neoprene-based (solvent types), neoprene-based (water emulsions), nitrile-rubber-based types (water emulsion), phenol-formaldehyde type polybutadienes, silicone resins in various solvents, and urea-formaldehydes and polyesters. Adhesives that may be utilized to bond to glass backing members include:

Polyvinyl acetates
Polyvinyl acetates — dibutyl phthalates
Polyvinyl chloride — acetate alcohols
Polyvinyl butyral — dibutyl phthalates
Methyl methacrylates
N-propyl methacrylates
Polyvinyl alcohols
Polyvinyl chlorides
Cellulose nitrates
Ethyl celluloses
Phenolics
Substituted phenol aldehydes
Aryl sulfonamide formaldehydes
Styrene butadienes
Neoprene Type GN-A
Butadiene acrylonitriles
Epoxies Various combinations of polymeric substance also useful as glass adhesives include:

Polyvinyl butyral — cresylic phenols
Polyvinyl butyral — oil and ester gum-modified phenolics
Polyvinyl butyral-terpene phenolics
Vinyl copolymers (chloride-acetate-alcohol) vinyl butyral-phenolics
Polyvinyl chloride-acetate-alcohol with phenolics
Polyvinyl chloride-acetate with phenolics
Phenolic-Buna-N
Phenolic-butadiene-acrylonitriles
Cyclized rubber-polyvinyl chloride acetates
Polyacrylate Buna-N
Polyamide-epoxies It is clear that by use of any resin adhesive which will both effectively bond one component to itself as well as a second component to itself will generally suffice to effectively bond that first component to said second component and that where the situation exists such that a common adhesive cannot be found which will serve to bond both components to themselves, use may be made of two separate adhesive layers wherein one component is first "primed" with a second adhesive which is then compatible to the primary adhesive. In those cases where an interfacial panel is inserted between the anodized layer and the light transparent panel, the same principle may apply in that all three panels may employ a "primar" coating which may in each case vary depending on the nature of the panel so that as many as four primer coatings may be employed for a three panel system and so on if a common laminating or adhesive material is not available.

The invention will be more fully appreciated from the description which follows taken in conjunction with the drawings in which:

FIG. 1 is a plane view of a fragment of a transparency; according to the invention;

FIG. 2 is a view in section taken on plane 2—2 of FIG. 1;

FIG. 3 is a magnified schematic, cross sectional view of a portion of an unsealed, anodized aluminum plate wherein a fully developed photographic silver or dye image is embedded;

FIG. 4 is a view of the anodized aluminum article of FIG. 3 which has been laminated face down to a suitable supporting substrate;

FIG. 5 is a view similar to FIG. 4 after the aluminum metal backing member has been removed from said article;

FIG. 6 shows a modification wherein an imaged anodized aluminum plate is separated by a small air space from a light-transmitting panel, portions of the aluminum member directly behind the nonimage portion of the anodized layer having been selectively removed;

FIG. 7 is a similar view showing another embodiment;

FIG. 8 is a view similar to FIG. 5 except that the clear transparent plastic supporting layer penetrates the pores of the image-containing porous anodized layer;

FIG. 9 is a cross sectional schematic view of a further modification in which the electrically insulating anodized layer contains a conductive metal pattern superimposed upon a photographically produced silver image, both of which are embedded in the pores of the anodized layer;

FIG. 10 is a view similar to that in FIG. 9 but discloses another embodiment wherein the conductive pattern is formed exterior to the silver image in the anodized substrate.

FIGS. 11 through 22 are similar to the preceding figures, illustrating further embodiments of the invention.

Figure 19:
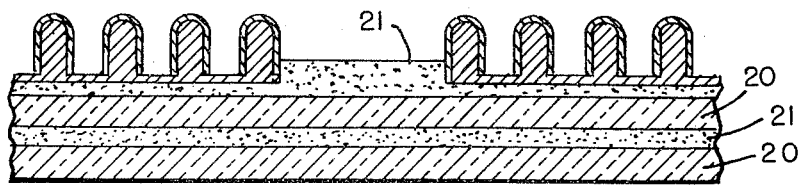

Referring, now for purposes of illustration to FIGS. 1 and 2 showing a transparency prepared according to the present invention, as seen in FIG. 2, the article includes a composite aluminum oxide layer formed by anodization of a base which has been removed from the article. The aluminum oxide layer comprises a porous layer 3, having hills and valleys defining surface pores 6 and underlying barrier layer 4 consisting of a non-porous aluminum oxide film originally deposited on the surface of the aluminum base. Superposed on the anodized layer 3 and secured thereto by a transparent adhesive 2 is a transparent sheet 1 of glass, quartz, or other clear polymer, such as "Plexiglass", or polymethylmethacrylate. The walls of some of the pores 6 are lined with silver 7 or other suitable metal for example as taught in such prior art as U.S. Pat. Nos. 2,115,339 and 2,766,119. The metal-image-containing pores in aluminum oxide layer 3 are filled with nickel 5, or other metal which increases the opacity of a silver image; the nickel or other metal which being deposited by electroless deposition to an extent sufficient to fill the pores.

FIG. 3 shows an early stage in the manufacture of the article of FIGS. 1 and 5. FIG. 3 shows in section a fragment of a porous anodized aluminum article 10 containing a silver or dye image 15, produced by known processes such as those described in Mason U.S. Pat. No. 2,115,339 and in Freedman et al U.S. Pat. No. 2,766,119. The image is surrounded by the anodized layer 17 which is both chemically and physically an integral part of the aluminum base 18 to which layer 17 is connected by a thin non-porous layer 13 of aluminum oxide commonly called a "barrier" anodic layer in this art. The opaque area 16 surrounding a non-image, clear or translucent area 14 may define a set of words or numerals referred to as indicia.

FIG. 4 shows the imaged anodized plate 10 of FIG. 3, after it has been suitably bonded face down to a clear light-transmitting panel 20 by means of a clear adhesive 21 to form a further intermediate in the production of the article of FIGS. 1 and 5.

FIG. 5 shows the article of FIG. 4 after removal of the aluminum base 18 from the article of FIG. 4. Like the article in FIG. 1, the resulting article consists of the indicia portion of a light transparent panel and the supporting clear light-transmitting panel. It can be seen from FIGS. 2 and 5 that the non-porous barrier layer surface of the anodized layer now facing the viewer possesses the same resistance to abrasion and chemical attack and various other environmental influences as a sealed, anodized layer. However the panel and the image therein can now be viewed by both reflected and transmitted light.

By laminating the imaged, anodized aluminum plate shown in FIG. 3 face down to a light-tramsitting panel 20 as shown in FIG. 4, and subsequently removing the aluminum base 18 as shown in FIG. 5, a method is defined for the production of edge illuminated panels. For this purpose the light-transmitting panel 20 preferably is fabricated from any acrylic resin. The adhesive material 21 may consist of a clear transparent material or may be a white translucent coating; depending on the degree of contrast both of reflected and transmitted light that is desired.

FIG. 6 is a sectional view showing a further embodiment of the invention prepared using a 20 mil thick aluminum plate 18 anodized on both faces to produce a barrier layer 13 and a porous oxide layer 17 on each surface. One surface of the article contains a photographically developed silver or dye image 15. The dye image forms the black background defining the indicia 14 composed of non-image areas of anodized aluminum. The reverse side of this panel is coated with a photoresist material, and then using the same negative as used for obtaining the silver image 15 on the other side, and in registry therewith, the resist is exposed to a U.V. source of approximately 100 millijoules. The resist is cured in the usual way and unexposed portions are removed. Then the exposed oxide layer 17, barrier layer 13 and finally the exposed portions of the aluminum backing member 18 are removed directly behind the indicia porton of the plate. After portions of layer 18 have been removed and before layer 20 is laminated to the image bearing anodized aluminum article of FIG. 3, a strip of silicone resin 25 is affixed to layer 18 and serves to space layer 18 from clear panel 20 and defines an air space between the two members. This completes the article of FIG. 6.

FIG. 7 is a fragmentary sectional view similar to the preceding Figures and illustrates an article formed by assembling the two image bearing anodized plates together in order to form a circuit including some source of illumination in the package, in this case the illumination is furnished by diodes 23.

FIG. 8 illustrates an embodiment in which the anodized layer 17 is supported solely by the adhesive material 21, which material preferably penetrates the porous oxide layer 17 to some degree and forms a thin continuous coherent coating above the porous anodized structure bearing a metal or dye image 15 which may be modified by electroless deposition of metal as previously described, prior to application of layer 21. The layer 21 may be comprise a resin which has been dissolved in a suitable solvent or a liquid plastic resinous material or wax, or lacquer or the like, or sheet material which can be colored or clear, translucent or opaque, or any combination thereof which, when taken together with the above mentioned anodized layer, constitues a "free" film and which may be either rigid or flexible in nature. The opposite face consists of barrier layer 13 of non-porous aluminum oxide.

FIG. 9 illustrates the result of increasing the electroless deposition thickness to the extent that the electrolessly deposited metal completely fills the pores in anodized layer 17 and overflows the pores. The deposited metal 22 will then deposit outwardly from the pore, along the anodized surface, until the deposited metal contacts other electrolessly deposited metal "growing" along the surface from a neighboring filled pore. In this manner an electrically conductive bridge 22 is obtained whose path is determined by the photographically reduced silver image pattern within the anodized porous layer 17.

FIG. 10 illustrates still another embodiment of this invention which is similar to that desccribed in FIG. 9 with the exception that the conductive pattern 22 is exposed and is not enclosed between the laminating structure 21 and the anodized layer 17.

Figure 20:
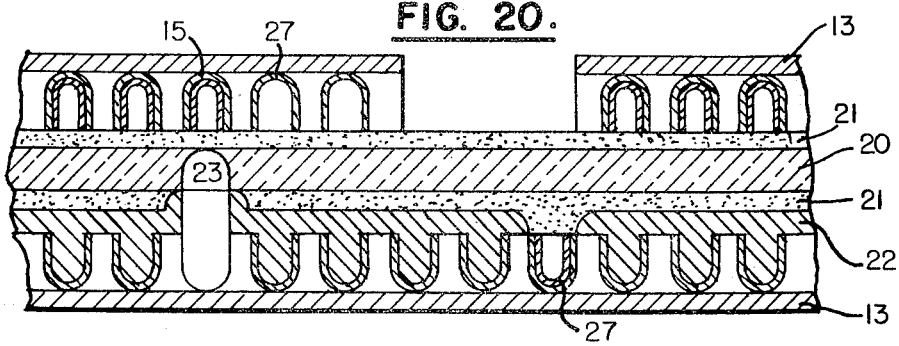
Figure 21:
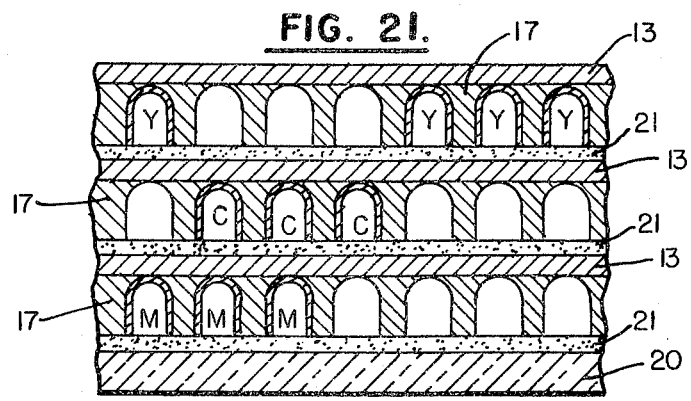
Figure 22:
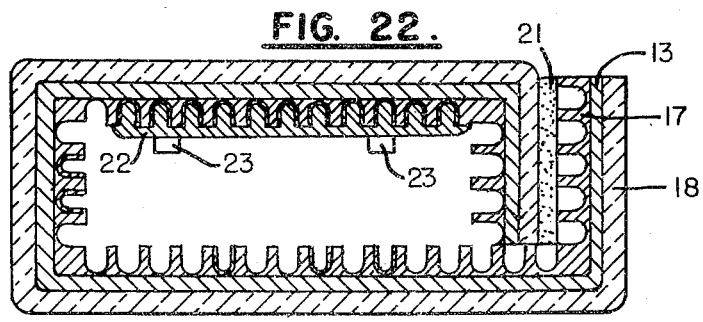

FIGS. 11 through 22 are similar to the preceding Figures, illustrating further embodiments of the invention.

The examples which follow are intended to illustrate various aspects of the invention and are not intended to limit the same.

EXAMPLE 1 (FIGS. 1 and 5)

Utilizing a 3 mil thick, unsealed aluminum plate 6x12 inches in size, the aluminum was anodized using any of the known procedures, for example those described in the text "The Surface Treatment and Finishing of Aluminum and its Alloys" by S. Wernick and R. Pinner, published by R. Draper, Teddington, England (1956 and 1959). Then a silver image was embedded within the anodized layer, for example in the manner described in U.S. Pat. No. 2,115,339 or No. 2,766,119 or by any other known suitable technique. The indicia were formed of non-silver areas surrounded by a black photographic silver background area, the black silver image areas exhibited a diffuse density of 2.3. The non-silver areas exhibited a value of 0.1–0.2. The silver-image bearing, unsealed, anodized plate was laminated face down to a sheet of 3/16 inch thick polymethylmethacrylate using an epoxy adhesive with an amine catalyst, and subsequently cured at 300°F for 30 minutes. After cooling the entire panel was briefly immersed in a warm 10% sodium hydroxide solution to remove the light oxide coating; then the entire panel was immersed in concentrated hydrochloric acid containing 5% by volume of 20% hydrogen peroxide solution. The aluminum base was removed in approximately 1 minute, leaving the article of FIG. 5 which may be used as an edge illuminated panel laminated to a light-transmitting panel.

EXAMPLE 2 (FIG. 6)

A 20 ml thick, anodized aluminum plate containing a slver image embedded within the anodized layer was prepared as described in Example 1, and then sealed in the usual way. The sealed plate was coated with a photoresist material and then exposed to an ultraviolet source of approximately 100 millijoules usng the same negative as employed for the obverse silver image and held in registry thereto. The resist was then cured by heating at 140°C for 25 seconds after which the unexposed portions light-transmitting the resist were removed by immersion in water. The exposed portion of the anodized layer was bathed in 10% sodium hydroxide to selectively remove the oxide layer, then the exposed aluminum metal backing member was selectively removed in a hydrochloric acid etching bath as described in Example 1. The panel was then laminated at the edge portions of a 3/16 inch thick polymethylmethacrylate panel using a relatively thick bead of a silicone resin and allowed to cure so that a small air space was provided between the anodized indicia panel 10 and the lighttransmitting panel 20.

EXAMPLE 3 (FIG. 7)

An unsealed, anodized aluminum plate, the pores of which contained a silver image in the form of a printed circuit pattern was electrolessly plated with a commercial electroless nickel solution which deposited a conductive nickel pattern superimposed on the silver image pattern. The methyl methacrylate sheet laminated to the indicia panel prepared as described in Example 1 was drilled out in a preselected area on the reverse side of the panel to accommodate gallium phosphide light-emitting diodes which were then "potted" in place with the leads protruding out of the surface of the light-transmitting, methyl methacrylate panel of Example 1. An anodized aluminum plate containing a conductive nickel pattern (see FIG. 9) was then laminated using a room temperature cure epoxy adhesive so that each side of the of the electrically conductive pattern contacted the appropriate light-emitting diode contact. By masking the edge portions of the light-transmitting panel in order to seal them from light, an edge illuminated panel was obtained consisting of a first continuous circuit completed through the diode to a second continuous circuit.

EXAMPLE 4 (FIG. 8)

An anodized aluminum foil plate containing a silver image embedded within the anodized porous structure, prepared as described in Example 1, was coated with an epoxy resin dissolved in methyl ethyl ketone. A thin epoxy film was coated on the porous surface and the epoxy resin penetrated into the porous anodized structure. The epoxy was cured for 5 minutes at 350°F. The aluminum metal base was removed as in Example 1. As a result, a "free" film was obtained which had an image to background density ratio of 2 to 0.1 to diffuse transmitted light. The impregnated anodized portion of the film would not accept a dye or stain, indicating that the anodized layer was nonporous.

EXAMPLE 5 (FIG. 11)

An unsealed, anodized aluminum foil plate identical to that described in Example 1 was utilized. The imaged plate was immersed in a dilute aqueous solution of lead acetate, then lightly rinsed, then immersed in a slightly more concentrated aqueous solution of ammonium sulfate whereby lead sulfate was deposited as a lining in the pores of the anodized layer, which was then rinsed thoroughly under running water and dried. The plate was then laminated face down to the light-transmitting panel. The supporting aluminum base was removed. The amount of translucent light passing through the indicia portion of the indicia panel can be varied depending upon the amount of white lead sulfate 27 produced in the pores of the anodized porous structure, which can be determined prior to laminating the anodized plate to the light-transmitting panel. Since the black silver image 15 is present prior to the lead sulfate precipitation, the diffuse density of the slver background image portion is increased from 2.5 to 3.5.

EXAMPLE 6 (FIG. 12)

An unsealed, anodized aluminum foil plate having the approximate rectangular dimensions of 6 × 12 inches and 3 mils thickness, and containing an image defining indicia as described in Example 5, but, in addition, having areas 12 devoid of any material, defining openings for the unobstructed passage of light from the light-transmitting panel was utilized. A double faced polyester adhesive film 20' was positioned over the image, the adhesive film having an opening 12 corresponding to and superimposed over each of the desired openings 12 defined in the anodized layer and then heat laminated face down to a clear allyldiglycolcarbonate sheet 20 3/16 inch thick and having the same approximate rectangular dimensions as the imaged anodized plate 10. The aluminum metal base 18 was then removed and the area defining that portion of the anodized layer containing no adhesive was removed by probing under and lifting out the sharply defined, nonbonded section 12 which now allows for the unobstructed passage of light from the light-transmitting panel for the purpose of illuminating dials and pointers and the like situated above the edge illuminated panel.

EXAMPLE 7 (FIG. 9)

A 3 mil thick, anodized aluminum foil plate which contained a photographic silver image embedded in the unsealed, anodized layer in the form of a conductive pattern or printed circuit was immersed in an electroless nickel plating solution until a conductive pattern of nickel was deposited on the photographic silver image. The plate was then laminated face down to a thin methyl methacrylate sheet using a phenolic-epoxy adhesive. The aluminum base was then removed by the technique described in Example 1.

EXAMPLE 8 (FIG. 10)

An unsealed, anodized aluminum foil plate approximately 0.003 inch thick upon which an anodized layer approximately one-third of a mil in thickness is present on one side only of the foil plate and which contains a reduced silver image defining a printed circuit was coated and impregnated with a dilute epoxy resin (Shell's Epon 1004) dissolved in methyl ethyl ketone. Upon drying, the film was cured by heating at 350°F for 5 minutes after which the entire exposed aluminum metal backing member was removed by etching in a saturated solution of mercuric chloride and rinsed. The barrier oxide layer 13 (see FIG. 5) was then removed by a brief immersion in an aqueous solution containing 35 milliliters of phosphoric acid per liter and 20 grams of chromic acid per liter at room temperature. The plate was then rinsed thoroughly in running water. The reduced silver image was now exposed, being held in place within the epoxy impregnated anodized cell walls. The panel was then immersed in an electroless nickel plating bath which resulted in deposition of a conductive pattern of nickel superimposed on the silver image.

EXAMPLE 9 (FIG. 5)

A sealed, anodized aluminum foil plate containing a reduced silver image which had been intensified by a chemical deposition technique using a conventional photographic gold intensifier-toner solution was laminated face down to a sheet of optically clear transparent glass using a clear, heat curing epoxy resin-catalyst adhesive formulaton. The aluminum metal backing member was then removed as described in Example 1. The above described panel was found to be equivalent to a normally sealed, anodized layer, exhibiting outstanding chemical and durability characteristics and would not accept a dye or stain.

EXAMPLE 10 (FIG. 13)

An unsealed, anodized aluminum plate similar in respect to Example 1 was utilized except that the laminating adhesive 21' was composed of a white translucent epoxy-phenolic combination resin to laminate the indicia panel to the light-transmitting panel. The light-transmitting panel exhibited an increase in the transmitted diffuse lighting effect in the translucent areas forming the indicia when the panel was edge illuminated by a miniature tungsten filament bulb enclosed in a red transparent filter cap and the sides and back portion of the light-transmitting panel was sealed with respect to light by laminating a highly reflective aluminum foil with a pressure sensitive polyester adhesive.

Colored sheet filters may be laminated between the light-transmitting panel and the anodized layer or the laminating material itself may be of a translucent color rather than white or clear.

EXAMPLE 11 (FIG. 14)

An image bearing, unsealed, anodized aluminum plate was again utilized except a thin sheet of red colored polyvinyl chloride 20' was laminated to the anodized surface and to the methyl methacrylate panel using an unsaturated polyester-styrene adhesive. The entire package was then treated as in Example 1 to remove the aluminum metal backing member.

Since certain portions of the indicia panel must allow internally transmitted light to pass through the indicia panel unobstructed by either the opaque area 16 or the translucent area defined by 14 for the purpose of illuminating dials, pointers, or other indicators located above the indicia panel, the imaged anodized aluminum plate may be made discontinuous in those areas by simply drilling or routing out, for example, in those areas 12 prior to lamination of the light-transmitting panel.

EXAMPLE 12 (FIG. 15)

A sealed, imaged, anodized aluminum plate was prepared as described in Example 2 except that the selectively removed portions of the aluminum metal backing layer were filled with a white translucent epoxy formulation 26 using the obverse anodized layer as the supporting member to form the indicia. Those areas predetermined for the unobstructed illumination of light for the purpose of illuminating dials and pointers located above the panel were left unfilled and the fragile unsupported anodized layer mechanically removed in those areas.

EXAMPLE 13 (FIG. 16)

A sealed, anodized aluminum plate, 0.020 inch thick and of rectangular dimensions approximately 6 × 12 inches was prepared wherein within the sealed, anodized layer was a black dye blanket color, and the fragile unsupported anodized portions from which the aluminum backing member had been selectively removed were themselves removed by the method described in Example 12 and preformed white plastic translucent inserts 26 were placed into those areas defining the indicia, whereas those areas defining portions to allow for the unobstructed passage of light in order to illuminate dials and pointers located above the panel were left unfilled.

Instead, the indicia portions of the panel where the aluminum backing member has been selectively removed may be filled from the reverse side with a translucent material using the anodized obverse layer as the supporting member for the filled portion. Alternatively, the anodized layer forming the indicia portion of the panel may easily be removed by either a mechanical or chemical etching action and the total void filled with a preformed plastic translucent insert. This provides for the unobstructed passage of internally transmitted light for the purpose of illuminating indicators and the like situated above the indicia panel. Or, the above described panel after the selective removal of the aluminum metal backing may be laminated directly to a translucent glass or plastic insert which, as in previous examples, may then be laminated directly to the light-transmitting panel or supported above the light-transmitting panel and separated by a small air space. The above described panel may be mounted to the previously mentioned translucent panel insert or directly to the light-transmitting panel upon which contains raised or embossed indicia identical with and in juxtaposition to openings formed in the above described indicia panel.

EXAMPLE 14

Two imaged, anodized plates were made transparent in selected areas as described in Example 2, except that a white translucent polyvinyl chloride panel was laminated directly to the reverse side of the anodized aluminum plate using an unsaturated polyester-styrene adhesive. One such plate was mounted above and separated from the methylmethacrylate panel by a thin silicone resin bead placed around the periphery of the panel. The second plate was laminated directly to the methylmethacrylate panel using the unsaturated polyester-styrene adhesive.

EXAMPLE 15 (FIG. 17)

A sealed, imaged, anodized aluminum plate was made transparent in preselected areas as described in Example 2, and a thin white translucent polyester film was set on the reverse side of the anodized plate and heated until the polyester became soft and sagged into and through the preselected openings of the anodized aluminum plate, thereby forming raised indicia identical with and in juxtaposition to the openings formed in the above described panel, thereby serving to accentuate the indicia. The above described panel arrangement was then adhesively bonded using a room temperature cure epoxy and mounted above but not in contact with a 3/16 inch thick methyl methacrylate panel using a thin bead of silicone resin around the periphery of the panel and allowing to cure at room temperature.

EXAMPLE 16

A sealed, imaged, anodized aluminum plate was made transparent in preselected areas as described in Example 2 and subsequently treated as described in Example 15, except that the double panel arrangement containing raised translucent indicia was laminated directly to the methyl methacrylate panel using a two-sided heat laminated polyester adhesive film coated onto a Mylar base.

In still another mode, the above described indicia panel provides for the option of utilizing a highly specularly reflective surface since the above described reverse side of the indicia panel may be polished either before or after the selective removal of the aluminum metal backing member.

EXAMPLE 17

A sealed, imaged, anodized aluminum panel, 0.020 inch in thickness was made transparent in preselected areas as described in Example 2 and subsequently treated as in Example 12, except that the reverse side of the aluminum panel was mechanically polished after removal of the oxide layer by buffing on a wheel in contact with a commercial polishing rouge, followed by a light buffing using a mop consisting of a series of calico discs sewn together near the center of the wheel. The aluminum was then brought to a mirror finish using a soft muslin disc and Vienna lime, and then laminated to an allyl glycolate panel having smooth parallel polished surfaces using a heat curable polyester adhesive to effect the lamination.

The anodized aluminum metal article may be used in the unsensitized state, i.e. the preformed panel after removing the aluminum backing member in preselected areas together with the anodized layer directly above said area may then be colored by a dye or other suitable coloring material and then sealed in the conventional mode, irrespective of whether the anodized plate has been first laminated to a translucent panel or a light-transmitting panel either in optical contact or by maintaining a small separation of the anodized aluminum-translucent panel combination from the light-transmitting panel or by utilizing the specularly reflective backing concept.

EXAMPLE 18

An unsealed, unsensitized, anodized aluminum plate, 20 mils in thickness and approximating a rectangular shape of 6 inches by 9 inches in size, both sides of the plate having an anodized layer of about 0.5 mils thickness was laminated to a 3/16 inch thick polymethylmethacrylate panel of the same dimension using a heat curable two-sided translucent polyester adhesive. The laminated panel arrangement was then coated with a photoresist and exposed to a negative wherein the indicia pattern was not light struck whereas the resist area conforming to the background area was exposed, causing these areas to become insoluble to water, mineral acids and alkali solutions using an ultraviolet light source of approximately 100 millijoules exposure. Following exposure, the resist coating was cured by heating at 150°F for 1 minute then immersed briefly in water to remove the unexposed portions of the resist forming the indicia. Since this resist material forms a color in the light struck area, the quality of the finished product can be evaluated at this point. The exposed portions of the anodized layer were then removed by a brief immersion in an aqueous 10% potassium hydroxide solution at 50°C. The exposed aluminum metal was then removed in a concentrated solution of hydrochloric acid containing 5% by volume 30% hydrogen peroxide and rinsed and dried, leaving the second anodized layer intact which now forms the translucent indicia. The plate was then instantly dyed black using a commercial black aluminum dye. The anodized layer was now sealed by immersing in a cobalt-nickel acetate bath for 5 minutes at 95°C. Since the barrier layer constituting the translucent indicia facing the viewer represents a sealed or nonporous anodized structure, this portion of the panel will not accept a dye. For the purpose of permitting the unobstructed passage of light from the light-transmitting panel for the production of illuminating dials and pointers located above the face of the panel, those portions constituting such areas were removed by dissolving the second or interfacial anodized layer by the alkaline treatment. Since the indicia are now situated on a plane below the obverse surface of the plane of the indicia panel, this serves to further accentuate the contrast between the translucent indicia and the black opaque background of the indicia panel when viewed by reflected light. In addition, by removing the interfacial laminated anodized portions of the indicia panel, the degree of internally transmitted light can be varied from 100% transmission to any lesser degree of diffuse transmitted light by filling the exposed indicia portions with a suitable translucent material, hence a high degree of diffuse light control is now attainable.

EXAMPLE 19

In this example the exact same procedure was followed as described in Example 18, except the anodized aluminum utilized was anodized on one side only, the interfacial layer or side being of a high specular reflectance which was placed in optical contact with the light-transmitting panel using a clear, two-sided, heat laminated, polyester resin film. In this case it was necessary to make the indicia translucent which was accomplished by filling the indicia portions of the panel with a white translucent polyester resin.

EXAMPLE 20

An unsealed, unsensitized, anodized aluminum plate having the rectangular dimensions of 8 inches by 11 inches, 20 mils in thickness, being covered uniformly on both sides by an anodized layer approximately 0.005 inch in thickness was first immersed in a dilute aqueous solution of lead acetate, rinsed lightly, then immersed in a slightly more concentrated solution of ammonium sulfate after which the plate was rinsed thoroughly with water and dried, which serves to precipitate white lead sulfate within the porous anodized structure. The plate was then coated on both sides with the same resist material described in Example 18 and the obverse side exposed in the same manner; however, the reverse side was exposed using a direct positive transparency with respect to the transparency used for the obverse resist exposure and held in registry thereto and constructed such that the light protected areas constituting the indicia image of the positive transparency were somewhat enlarged with respect to the indicia of the obverse portion of the panel. Following exposure of both sides of the panel, the resist was fully developed and cured as described in Example 18, and the exposed portions of the anodized layers on both sides removed by immersion in an aqueous 10% potassium hydroxide solution which was heated at 60°C, then rinsed thoroughly in water and dried. The obverse side of the panel now contains exposed aluminum metal which forms the indicia and those areas provided for the unobstructed passage of light which is surrounded by the anodized layer containing lead sulfate. The reverse side of the panel contains the lead sulfate bearing anodized layer in the form of enlarged indicia directly behind the exposed aluminum forming indicia but the anodized layer is removed behind the areas which are to provide for the unobstructed passage of internal transmitted light for the illumination of dials and pointers which will be subsequently located above the indicia panel. The exposed aluminum reverse surface after removal of the anodized layer now contains a highly specular reflective surface which was laminated in optical contact using a heat curable polyester adhesive to a polymeric allyl glycolate transparent panel, 3/16 inch thick, and having the same rectangular dimensions as the anodized panel and having its upper and lower surfaces in parallel relation to each other and polished to provide a smooth optical surface. The laminated panel was then immersed in a bath of concentrated hydrochloric acid containing 5% by volume of 30% hydrogen peroxide which served to remove the exposed aluminum metal forming the indicia of the obverse portion of the indicia panel, leaving the interfacial anodized layer containing white lead sulfate intact. The indicia panel was then instantly colored using a commercial black dye and sealed by immersion in a cobalt-nickel acetate bath for 5 minutes at a temperature of 95°C. Since the interfacial laminated anodized layer representing the indicia and facing the viewer constitutes an intact barrier layer, these areas will not accept a dye and will remain white or whatever color was initially chosen. The areas which are to provide unrestricted transmitted light from the light transmitting panel now consist of the clear polyester laminating surface and also will not accept a dye, providing the dye vehicle is not a solvent for the laminating agent.

EXAMPLE 21 (FIG. 5)

An unsealed, imaged, anodized foil plate having a brushed or matte finish was utilized as described in Example 1, except the plate was laminated face down to a pressure sensitive, heat sensitive, clear, polyester film supported on a polyester backing member. The entire aluminum metal backing member was then removed and the resulting film was found to be translucent in the nonimage areas.

EXAMPLE 22 (FIG. 5)

A sealed, imaged, anodized aluminum foil plate was treated exactly the same as described for Example 21. In this case a more transparent clear, nonimage area was evident than that defined in Example 21 since the anodized layer was no longer porous but amorphous and therefore would not scatter transmitted light to the same degree.

Such films may be used for a variety of purposes, depending upon the nature of the material 21. When the supporting material 21 constitutes a clear or translucent coating, the film so produced may be used as previously described for the production of the indicia panel of edge illuminated panels. Additionally, in this respect the supporting material 21, if of sufficient thickness and optical clarity, may constitute the light-transmitting panel 20 itself referred to in FIG. 5.

By utilizing very thin films which are optically clear and transparent such as layer 21 of FIG. 8, methods are thereby available for the manufacture of various articles such as photomasks, microimaging cards and holograms, for example, and which form additional objects and embodiments of this invention and which will now be described more fully.

It is well known to those familiar in the art of providing porous anodic oxide coatings of various aluminum articles that the porosity of various oxide coatings produced may routinely vary, the number of pores ranging between $25 \times 10^9$ and $500 \times 10^9$ pores per square inch, depending upon the electrolyte utilized in the anodizing bath, the voltage employed and various other factors. Assuming that a photographically sensitized anodized aluminum article containing silver halide embedded within such a porous structure to the extent that the sensitive material resides solely within the porous structure as opposed to coating the anodic oxide surface, then such an article when exposed to light and developed and fixed in the normal photographic mode would represent a resolution capability of the same order of magnitude as that of visible light itself. However, due to various factors such as internal reflections and the scattering of the impinging light rays, as well as the possibility of the existence of a mixture of macroporous and microporous structure as well as the possibility of discontinuities and nonlinearity of the individual pores themselves, this theoretical resolution capability of photographically sensitized anodized aluminum articles is not realized in practice. However, line pairs of the order of 1200 to 1600 lines per millimeter are routinely realized with routinely produced anodic layers which is well within the resolution range required for the production of reflectance type microimaging articles. By utilizing the technique of removing the aluminum metal backing member referred to previously, the article then described in FIG. 8 forms the basis for the production of novel highly durable transparent microcards which may be produced by conventional photographic reduction techniques or by contact printing of conventionally reduced negatives, referred to commonly as "microfiche" cards. The photographic silver image thus produced may be enhanced by any of the well known techniques referred to as "image intensification" prior to applying layer 21, e.g. as described in the following Examples.

EXAMPLE 23

A sealed, anodized aluminum foil plate was contact printed using a conventional silver emulsion reduced negative or microfiche card as the negative in such a manner to make the anodized image right reading. The silver image produced in the anodized layer was then toned with a conventional gold toning solution in order to increase the density of the image portion of the anodized aluminum which was then sealed and heat laminated to an epoxy coated polyester sheet 3 mil in thickness and the entire aluminum backing member removed. When viewed with magnified transmitted light, equivalent resolution capability to that of the original was evident, except the image was now reversed.

EXAMPLE 24

A reduced image was obtained identical to that described in Example 23, except the anodized layer was removed after removal of the aluminum metal backing member by immersing the film in a 10% sodium hydroxide solution for several minutes at room temperature. The resulting film when viewed under magnified transmitted light was characterized by a higher degree of light transmission in the nonimage area of the plate than that obtained in Example 23. Since the films described in this example and in Example 23 are now positive transparencies of the original microfiche card, a product which is not only ideally suited for archival storage but also suited for the reproduction of contact prints therefrom is obtained.

Alternately, the density of the reduced silver image may be increased by a technique referred to as "electroless metal plating" and which briefly consists of catalytically depositing a metal less noble than that of silver upon the reduced silver image in the presence of suitable reducing agents; the silver image in this case acting as the catalytic nuclei upon which the reduced metal is then deposited. In this manner a metal such as nickel, for example, may be deposited upon the reduced silver image within the anodized pore itself which results in an extremely black image, as illustrated in Example 25.

EXAMPLE 25 (FIG. 18)

An anodized aluminum foil plate was utilized and treated exactly as in Example 24, except the photographic silver image was intensified by an electroless nickel plating solution to a dense black image having a diffuse transmitted light density ratio of 3 to 0.1 in the image-nonimage areas.

The article produced was found to be very durable, possessed a high density ratio of transmitted light regarding the ratio of density in the image area compared to the non-image area, exhibited high resolution capabilities and was extremely well suited for use as a permanent microimage record or for use as a photomask.

EXAMPLE 26 (FIG. 9)

An anodized aluminum foil plate was obtained as defined in Example 23, except the electroless nickel deposit was increased to the point that the image was of a reflective metallic appearance and electrical continuity was obtained between connecting lines.

The product of FIG. 9, therefore, provides not only for the extreme density of the image equivalent to metal photomask but increases also the simplicity of producing such masks as well as the resolution capability of such masks irrespective of the electroless metal deposition utilized.

EXAMPLE 27 (FIG. 19)

A silver imaged, anodized foil plate 0.003 inch thick containing an anodized layer approximately 10 microns thick containing line pairs ½ inch in length and consisting each of 5 microns separations and 5 microns wide; 10 micron separation and 10 micron wide, up to and including in the same manner 20, 50 and 100 micron lines, was obtained and immersed in a commercial electroless nickel plating bath until a metallic nickel deposit was obtained superimposed above the silver image and extending above the anodized surface pores. The foil plate was laminated face down to a clear, heat curable, polyester adhesive supported by a 0.03 inch thick polyester film and the aluminum metal backing removed by etching in concentrated hydrochloric acid. The anodized aluminum backing member was then removed in 10% aqueous sodium hydroxide solution, leaving the silver-nickel image intact and laminated to the polyester film. This resulted in a clear transparent background photomask wherein the diffuse light transmission density ratio was 4 to less than 0.1 in the image-nonimage area containing line widths and separations of 5, 10, 20, 50 and 100 microns.

Among those metals which can be electrolessly deposited on the developd silver image or a suitable sensitized silver image enveloped within the high dielectric, electrically resistant anodized layer as described in an application filed on Oct. 22, 1971, Ser. No. 191,635, and which are useful for various electronic applications including printed circuits and the like are: silver, copper, nickel, iron, chromium cobalt, gold platinum and palladium, including also certain alloys or mixtures of metals such as nickel-cobalt, cobalt-phosphorus, nickel-iron, etc. which are also useful in some applications for their unique magnetic properties which find use in obtaining the recording and reproduction of information. This is achieved by utilizing the previously mentioned photographically developed silver image embedded in the anodic porous structure as before wherein the porous structure is sealed and the resulting plate then coated with the supportive film 21 and an etchant used to remove the aluminum backing member which has a solvent effect on the anodized layer as well but does not attack the developed silver image which is subsequently used to catalytically deposit the various electrolessly deposited metals referred to previously. The solvent so chosen can be selected to satisfy any one of three conditions: (1) solvent for the aluminum backing member only, (2) solvent for the aluminum backing member plus a slight solvent action on the anodized layer and which can be confined to attack on primarily the barrier layer, or (3) solvent attack on both the aluminum backing member and the anodized layer to the extent that the anodized layer surrounding the silver image is removed, thereby necessitating in this case that the supportive layer 21 contact the silver image and that the anodized aluminum layer in this case is not sealed. This, of course, results in a substrate composed of a plastic film only, which has now been selectively sensitized for the electroless deposition of various metals referred to earlier. This aspect of the invention is described in the following examples:

EXAMPLE 28

An unsealed imaged anodized aluminum foil plate which had been polished to be specially reflective was provided with a silver image defining a conductive pattern or printed circuit arrangement upon which an electroless deposition of nickel metal was deposited as in Example 3, was laminated face down to a pressure sensitive-heat sensitive polyester film coated onto a polyester substrate and the entire aluminum backing member was removed as described in Example 1. Electrical contact was made to the enclosed circuit pattern by insertion of contact pins to contact points within the anodized structure. The dielectric strength constant of the unsealed anodized layer was approximately 7.5 and the surface smoothness, limited by the polishing lines of the original aluminum metal and replicated by the anodized layer was approximately 1–3 microinches CLA (Center Line Average).

EXAMPLE 29

An, unsealed, anodized silver imaged foil plate was utilized wherein the silver image was defined exactly as described in Example 28 and which was laminated face down to an optically flat glass substrate using a two part epoxy resin adhesive which was heat cured at 350°F for 30 minutes after which the aluminum metal backing member was removed by etching as described in Example 1. Next the anodized barrier layer only was removed by immersing the panel in an aqueous solution of phosphoric acid (3.5% by volume) and chromic acid (2% weight per volume) at room temperature for 1 minute and thoroughly rinsed which served to expose the silver image within the anodized epoxy layer.

The resulting panel was then immersed in a commercial electroless nickel plating bath whereupon an electrically conductive nickel deposit was obtained superimposed on the reduced silver image and was primarily above the anodized surface as described in FIG. 10. The epoxy-anodized layer was now characterized by a surface smoothness of approximately 0.5 to 1 microinches CLA.

EXAMPLE 30 (FIG. 10)

An unsealed imaged anodized foil plate was laminated to a glass plate using an epoxy adhesive as described in Example 29 after the reduced silver image had been first toned with a commercial gold toning solution. The resulting panel was then etched as before to remove the supporting aluminum backing member then the entire anodized layer was removed using an aqueous 10% sodium hydroxide solution resulting in the silver-gold image now being supported entirely by the epoxy resin. The panel was then immersed in a commercial electroless nickel plating solution and a conductive pattern of nickel was superimposed on the silver-gold image.

EXAMPLE 31

A panel was prepared the same as defined in Example 30 wherein the laminated anodized layer was removed and the glass-plastic plate was immersed in an electroless nickel solution whereupon an electroless deposit of nickel was superimposed on the silver image defined on and in contact with the epoxy resin.

Inasmuch as the nature of the solvent attack on the aluminum backing member and/or the anodized layer can be varied, it is possible to provide control over the various degrees of surface smoothness desired.

Referring now to FIG. 7, the invention is shown applied to a portion of a finished product of an edge illuminated panel which provides a unique method for transmitting electric current outside the light-transmitting panel 20 to the illuminating source 23 generally located within the light-transmitting panel and which may comprise miniature tungsten lamps or light-emitting diodes or the like. Those areas in FIG. 7 designated as 30 and 31 constitute electrolessly deposited metallic-conducting strips obtained as described in FIG. 9 from which conductor 30 may be made discontinuous from 31. Assuming that conductors 30 and 31 are connected to a source of external electrical energy, current flows from conductor 31 through illuminating source 23 through conductor 30 back to the external source. This is described in Example 32.

EXAMPLE 32 (FIG. 20)

An unsealed, anodized (one side only) aluminum foil panel 0.003 inches in thickness and having overall rectangular dimension of 12½ in. × 23½ in. containing a developed silver image wherein a series of 8 various dials were arranged, the indicia and other markings as before comprising the non-image portions anodized layer and containing thereupon a white barium sulfate 27 deposit was prepared with variously arranged cut-out portion of the panel for dial illumination. A second panel containing a conductive pattern of electroless deposited nickel was superimposed upon the developed silver image in such a manner to provide electrical current in parallel to a series of red gallium phosphide light emitting diodes arranged in such a manner that all portion of the instrument panel would be illuminated in case of failure in any one adjacent light source. The diodes were then soldered into place using a commercial lead base solder and suitable connector pins inserted thru the panel and soldered into place to provide a continuous path for the flow of current when connected to a suitable external source. The panel was then instantly dyed using a commercial black aluminum dye, then a white barium sulfate precipitate applied in the pores above the black dye. A 3/16 inch thick rectangular methyl methacrylate panel 12 in. × 23 in. having suitable arranged openings to accommodate the various lamps and connectors and dial openings was coated with a clear two part epoxy room-temperature cured resin formulation and the light emitting diode panel assembled to one side of the light transmitting panel. The indicia bearing panel was then assembled to the opposite side of the light transmitting using a clear heat curable double faced polyester laminating adhesive on a polyester substrate containing suitable arranged opening corresponding to those portions utilized for the illumination of dials or pointers arranged above the instrument panel and the edges folded down over the edge portion and heat laminated also to the light emitting panel. The connector pins extending through the reverse side of the edge illuminated panel were masked off with an adhesive tape and the entire panel immersed in a saturated solution of mercuric chloride to remove the entire aluminum backing layer surrounding the light transmitting panel.

Alternately the construction illustrated in FIG. 10 may be utilized wherein the illuminating source 23 utilizing external electrical connectors would extend through the anodized layer to provide ready access for purposes of replacement in the event of failure of any such illuminating source.

EXAMPLE 33

An anodized unsealed aluminum foil panel 0.003 inches thick and 12½ inches × 23½ inches in rectangular shape and containing the developed silver image outlining the non-image anodized areas which formed the same pattern as described in Example 32 was prepared in this example however omitting the impregnated white coating. A second panel was prepared again containing an electrolessly deposited conductive nickel pattern superimposed on the silver image, also as described in Example 32, and containing a white lead sulfate precipitate impregnated in the anodized porous layer surrounding the conductive pattern. A 3/16 inch thick light transmitting panel, 12 inches by 23 inches and having the same shape as the two aluminum oxide panels, consisting of a polished optically smooth methyl methacrylate panel having its two sides in parallel relation to each other was coated with a white translucent polyester double faced adhesive which in turn was coated onto a polyester supporting film. Both anodized aluminum panels were then heat laminated to the light transmitting panel with the indicia panel being folded down over the edge portions of the methacrylate panel. The entire panel was then immersed in a concentrated hydrochloric acid bath containing 3% by volume of 30% hydrogen peroxide to remove the entire aluminum metal backing member. The conductive pattern is now easily visible on the reverse side of the panel as well as the portions allocated for the placement of the illuminating sources. The illuminating positions were then routed out exactly to the size of the miniature tungsten light sources plus the red filter caps enclosing each light source and were inserted into the sockets and the pins of each lamp soldered into place using a commercial lead base solder after the anodized area immediately above the contact points was exposed by swabbing the area with 10% sodium hydroxide solution. The entire base area including the solder joints was then coated with a silicone adhesive-elastomer. This elastomer had a peel strength of 5 lbs. which is sufficient to bond the lamp area yet can be removed without destroying the integrity of the panel, and yet provides access to each lamp and solder joint which facilitates access to each lamp for purposes of replacement.

It is evident that the same techniques may be employed using the obverse portion of the panel utilized as the indicia panel or that a combination of the two panels may be utilized so that the indicia panel may carry electrical current to one side of the illuminating sorce 23 and return through the conductive layer defined on the reverse side of the panel back to the external source.

EXAMPLE 34

An indicia panel identical to that described in Example 33 was prepared except a conductive electroless nickel deposit was obtained over the entire silver image background area surrounding the non-image pattern containing impregnated barium sulfate corresponding to the indicia and other openings marking those areas for the illumination of dials and pointer located above the final panel. The reverse panel was prepared in the same manner being a mirror image of the above described indicia panel except that the indicia were somewhat enlarged. This panel was also made conductive by the electroless deposition of nickel throughout the silver image area and again the imaged portions were impregnated with white barium sulfate. As with the indicia panel the barium sulfate precipitation is specific in the indicia area since the surrounding metallic nickel area is non-porous.

A 3/16 inch thick panel of clear, light transmitting polymethylmethacrylate identical to that described in Example 32 was utilized, and was provided with polished cylindrical bores extending completely thru the light transmitting panel in order to accommodate a series of gallium phosphide red light emitting diodes containing thin flat wire leads. The openings in the panel were arranged in order to provide illumination evenly throughout the panel and to provide overall illumination in the event of failure of an adjacent diode. The openings were of a size to permit a friction fit of the cylindrical diode and one lead which were inserted into the panel with the lead facing the opposite direction of the main direction of illumination desired. Both leads of each diode were extending above and below the plane surfaces of the light transmitting panel and a double faced, clear, polyester laminating adhesive supported by an interfacial polyester film was placed in contact on both sides of the panel with the leads of light emitting diodes protruding thru the laminating film which also was discontinuous in those areas which were to be illuminated directly by internally transmitted light. The thin flat diode leads were then bent at right angles, parallel to the plane of the plane of the light transmitting panel and in contact with the adhesive laminating film.

Both the electroless nickel plated obverse and reverse panels containing indicia were then heat laminated to the polyester adhesive-methyl methacrylate panel with the flat diode leads contacting the nickel plated area of each panel thereby providing electrical continuity from the indicia panel, thru the diode and back through the reverse panel. The folded over edge portions of the panel were separated by excess laminating film to prevent shorting through the circuit. The entire panel was then immersed in a saturated solution of mercuric chloride to remove the aluminum metal backing member after which external contacts were made thru the panel by inserting a contact pin through the reverse side of the panel to contact the obverse nickel plated area surrounded by a cylindrical socket arrangement to contact the reverse nickel plated panel and both contacts were then potted in place using a room temperature cure, two part epoxy adhesive.

EXAMPLE 35

A sensitized anodized aluminum plate 0.02 inches in thickness and approximately three inches by six inches of rectangular dimensions containing on one side a left reading, enlarged indicia pattern composed of non-image anodized areas surrounded by a conductive electroless nickel background area superimposed on the silver image and containing in registry thereto and therefore right reading, on the reverse side a sealed silver image embedded within the anodized porous structure surrounding etched indicia which had been filled with a white translucent epoxy formulation using the anodized layer on the reverse side of the panel as the supporting layer. A second panel of sensitized anodized aluminum of the above same dimensions were prepared wherein the indicia were again of enlarged or exaggerated dimensions composed of non-image anodized aluminum which were surrounded by electrolessly deposited conductive nickel superimposed on the silver image. The indicia were in this case right reading.

A clear polymethylmethacrylate panel 3/16 inches thick and having the same overall dimensions as the above described panels, and having both smooth polished surfaces in parallel with each other was bored out near each corner and red light emitting gallium phosphide diodes containing a double pin connector arrangement were inserted in the panel with one lead extending through to the top surface and the other through to the reverse surface. Each contact lead was then furnished with a conductive epoxy resin bead which could be cured at room temperature. The indicia or top panel were then set into place using a thin bead of a room temperature cure silicone resin placed around the periphery of the indicia panel to provide a small separation and which served to contact the uncured conductive resin bead coating with the electrolessly deposited nickel surface. The reverse panel was then optically bonded to the methacrylate panel using a clear room temperature cure epoxy resin again with the conductive resin contacting the conductive nickel surface and allowing the entire single package arrangement to cure at room temperature.

The edge portions of the panel were covered by a pressure sensitive double faced polyester adhesive tape containing a high reflectivity aluminum foil which was separated from the indicia panel and the reverse panel by the adhesive.

Referring now again to FIG. 8, by utilizing an anodized aluminum plate which may or may not contain (at the discretion of the user) a photographic silver image which in turn may or may not be toned to a color other than black and if present is embedded within the porous anodized structure and optionally may contain in addition to, or of itself, a colored dye image also embedded in the anodized porous structure so that a colored image or series of colored images are obtained by any technique commonly utilized for obtaining or transferring an image as by a photoresist, lithography, offset or letterpress printing, mimeographing, silk screening, or painting by means of brush, roller or pneumatic or hydraulic spraying a fully colored or panchromatic or black and white information or pictorial display may be obtained which may be backlighted to enhance or increase the contrast of said anodized layer by laminating the layer to a suitable support and removing the aluminum metal backing member as is illustrated in FIG. 5 or FIG. 8, wherein a supporting layer is utilized or the laminating material constitutes the sole supporting member. This particular aspect of this invention is described by the following examples:

EXAMPLE 36

A 24 × 18 inch unsealed, unsensitized, anodized aluminum foil plate 0.003 inches thick, was coated with a resist material commercially, available from Horizons Research Incorporated. The resist coated plate was then exposed through and in contact with a separation negative to a 100 mj ultraviolet light source. The exposed area was then fully cured by heating at 145°C for 30 seconds whereupon the unexposed portion of the resist was then removed by a brief spray rinse in water and dried, following which a dye was applied to the exposed portion of the resist. This procedure was repeated using a total of three separation negatives and three resist coatings followed by a different colored dye impregnation between each operation. In this manner a multicolor color image was embedded in the anodized layer which was then heat laminated face down to a polyester coated polyester film whereupon the entire aluminum backing member was removed by etching in a saturated aqueous solution of mercuric chloride.

EXAMPLE 37 (FIG. 21)

Three 18 × 24 inch unsensitized anodized aluminum foil plates were exposed each to a separation negative and a separation dye image applied to each one while being held in registry one to the other, using the same scene described in Example 36. The panel corresponding to the main background color was then laminated face down to a clear optically flat polished glass substrate using a room temperature cure, two part clear epoxy resin and the aluminum backing member removed by etching in a concentrated hydrochloric acid bath. The second foil sheet containing the second separation image was then laminated face down to the first again usng the room temperature cure epoxy adhesive and the entire aluminum backing member removed and so on to the third dye image. In this manner a multicolor image was obtained which has a pronounced three dimension effect when viewed with transmitted or reflected light and which was suitable for outdoor display purposes.

EXAMPLE 38

A three color print was obtained on a 3 × 4 inch anodized aluminum foil plate as described in Example 36. The foil plate was then laminated face down to a cylindrical clear drinking glass using a room temperature cure, clear epoxy adhesive. The aluminum backing member was removed by etching resulting in a very attractive decal which was not subject to attack by repeated washings in a strong detergent, hot water or steam or other ordinary household chemicals, or by abrasion and the like.

EXAMPLE 39

A photoresist material was applied to an unsensitized, unsealed, anodized aluminum foil plate and selectively exposed and developed in the same manner as that described in Example 37. The entire plate was immersed in a dilute aqueous stannous chloride solution, briefly rinsed in distilled water, and then immersed in a dilute aqueous palladium chloride solution and vigorously rinsed under running tap water. In this manner the selectively exposed anodized porous surface is now selectively sensitized for the electroless deposition of various metals. The well rinsed plate was then immersed in an electroless nickel solution until a bright shiny deposit of nickel was formed in the exposed anodized areas. The excess resist material was then removed by immersing in a mixture of ethylene glycol monoethyl ether and water, dried thoroughly, then laminated face down to a cylindrical glass tumbler using a clear, heat curable epoxy adhesive. The aluminum metal backing member was then removed by etching. In this manner a very attractive metallic design was imparted to the article which was not subject to attack by repeated washings in various household detergents or chemicals, hot water or steam, and in addition was not prone to attack by abrasion or scratching, and had no tendency toward tarnishing or attack by various oxidizing agents.

EXAMPLE 40

An unsealed anodized aluminum foil plate containing within the anodized structure a continuous tone black silver image was immersed in a dilute aqueous solution of lead acetate, lightly rinsed with water and then immersed in a slightly stronger aqueous solution of ammonium sulfate, then rinsed again with water which resulted in white lead sulfate being precipitated in the anodized porous structure throughout. After drying the foil plate was laminated face down to a cylindrical glass tumbler using a heat curable epoxy resin. The aluminum metal backing member was then removed resulting in a very attractive matte black finish containing the silver image wherein the continuous tone was accentuated in the regions of lesser density and the areas in which no silver was present were characterized by a very soft translucent white coloration. As before, the article was not subject to attack by hot water or steam, ordinary household chemicals or detergents, abrasives or scratches or the like.

EXAMPLE 41

An unsealed anodized aluminum foil plate containing a continuous tone black silver image was coated with a metallic blue dye which was then superimposed on the black silver image as well as distributed throughout and within the anodized porous structure. The plate was then sealed in a commercial sealing bath of cobalt and nickel acetate and dried thoroughly prior to laminating to a cylindrical glass tumbler using a heat curable phenolicpolyvinyl buryrol adhesive at 350°F for 20 minutes. The aluminum metal backing member was then removed by etching and a very attractive continuous tone black silver image accentuated by the metallic blue dye present in the non silver image areas and being of a reverse continuous tone.

EXAMPLE 42

A series of unsealed anodized aluminum foil plates containing a photographically developed continuous tone silver image within the anodized structure were each bonded to a cylindrical glass tumbler using an epoxy adhesive each of which was filled with a Day-Glo phenol formaldehyde pigment structure of differing color. Since the epoxy was formulated to cure at room temperature the fluorescent properties of the various pigments were unimpaired. The aluminum backing member was removed in each case by etching and the result was a strikingly pronounced continuous tone fluorescent dye image effect which could be still further enhanced by backlighting of each cylinder and was not subject to any of the aforementioned modes of attack. In each case the amount of pigment utilized as well as the adhesive thickness could be varied to provide a degree of control over the fluorescent effect desired.

EXAMPLE 43

A small unsealed anodized aluminum foil plate containing a positive image of indicia wherein the indicia were formed of non-image anodized aluminum surrounded by the black silver image background, was immersed in a dilute aqueous solution of barium chloride, lightly rinsed, then immersed in a slightly more concentrated aqueous solution of ammonium sulfate and then rinsed well and dried. In this manner a white compound consisting of barium sulfate was precipitated in the pores of the aluminum oxide layer being superimposed upon the developed silver image. The plate was then laminated to the sidewall of a black automobile rubber tire using a Goodyear "Pliobond" adhesive and the aluminum backing member removed by etching resulting in a white indicia marking being strikingly delineated by the black photographically reduced silver outline which now constitutes a very durable, abrasion resistant flexible decal.

Alternately, selected areas of the aluminum backing member may be removed as described in Example 2 to provide for selected areas of transmitted light compared to areas using only reflected light, thereby serving to enhance or reinforce certain areas or to provide different sets of information, for example "open" as opposed to "close" or "on" vs "off", when the transmitted portion is lighted. A manner in which this description has been reduced to practice a particular aspect to this invention can now be described as follows.

EXAMPLE 44 (FIG. 7)

An unsealed anodized aluminum foil plate, 0.003 inches in thickness and having a rectangular dimension of eight by eleven inches was utilized containing an anodized layer on one side only of approximately ten microns in thickness within which was embedded a black photographically produced silver image outlining non-imaged portions of anodized aluminum in the form of indicia which in this case formed the words "ON" and "OFF" and reverse reading with the letter "O" being common to both words and the letters "N" and "FF" being intermingled. The entire indicia pattern was then impregnated with a blue dye designated "Sandoz Aluminum Blue B" by immersing the panel in an aqueous solution of the dye for ten minutes at 150°F, after which the plate was rinsed and dried. The plate was then coated with a very thin layer of the PR 543 resist material and dried. A negative transparency film was then placed over the letter "O" and that portion of the second indicia forming the combination letters "N" and "F" which consisted of a dot pattern spelling "ON" the dots consisting of a square array with each dot being approximately 20 microns in diameter, the edge of which contacts the edge of the immediately adjacent dots. Those portions of the combination letters "N" and "F" common only to the letter "F" were void of a dot pattern whereas those portions common only to the letter "N" were completely masked off. The resist was then exposed through this dot pattern and cured as before and the unexposed portions of the resist and dye removed by washing thoroughly in water. The entire panel was then immersed in an aqueous red dye solution designated "Sandoz Aluminum Bordeaux Red" for ten minutes at 150°F after which the panel was rinsed and dried and the cured resist coating removed by washing the panel in a mixture of ethylene glycol monoethyl ether and water and then dried. In this manner a mosaic colored design consisting of alternate red and blue dots was obtained forming the letter "O" and those portions of the second letter common to the letters "N" and "F" whereas those portions of the letter "N" common to that letter only were in red and those portions common only to the letter "F" were solely in blue.

The obverse panel was ⅜ inches larger in both directions than the colored indicia panel and of the same thickness and consisted of highly reflective electroless nickel deposit superimposed on the embedded silver image which in general outlined a non-image area directly behind the indicia which contained impregnated barium sulfate and consisted of a relatively large conductive pattern in the form of two completely separated circuits being separated by a thin line devoid of silver or deposited nickel and also containing impregnated barium sulfate, in such a manner that the maximum area of the panel contained the reflective nickel film. A set of miniature tungsten lamps containing optical red plastic filter caps were soldered into opposite corners on the conductive pattern and a second set of lamps containing optical blue filter caps were soldered into position at the opposite corners. The panel was then mounted onto a light transmitting panel containing oversized cylindrical bores within which the lamps were inserted using a room temperature cure clear polyester potting adhesive with the overlapping edge portions of the panel being folded over the edges of the light transmitting panel. The indicia panel was then laminated above the light transmitting panel using a heat curable white translucent polyester double faced adhesive after which the entire aluminum metal backing member surrounding the panel was removed by immersing in a saturated solution of mercuric chloride.

The colored indicia are now clearly visible surrounded by the opaque black silver image as well as the conductive pattern on the obverse panel to which external electrical connections were made by inserting contacting pins in the appropriate positions and potting into place. The contacting pins were then connected to an external switch in such a manner that when the switch was in the "ON" position the circuit containing the red colored lamps was activated and the blue colored lamp circuit was deactivated and when the switch was in the "OFF" position the circuit containing the blue colored lamps was activated and the red lamp circuit was then deactivated. The light emitting from the colored lamps are passed through the light transmitting panel and diffusely reflected by the white areas outlining the indicia of the reverse panel and directed through the indicia portion of the obverse panel wherein red colored light passes through those areas of the indicia containing red dye and are blocked or absorbed by those areas containing the blue dye, therefore the word "ON" appears in red. Conversely when the circuit containing the blue illuminators is activated blue light is passed through those areas containing blue dye and the red dye prohibits the transmission of diffusely reflected light therefore the word "OFF" is illuminated in blue light.

EXAMPLE 45

An unsealed anodized aluminum foil plate 0.003 inches in thickness and having a rectangular overall dimension of eighteen by twenty four inches was utilized, containing an anodized layer on one side only of approximately ten microns in thickness within which was embedded a black silver image contained throughout except for those areas of the indicia defining the words "NO. 1" at the top portion, the word "READY" positioned immediately below and the word "SPENT" occupying the lower third of the long side of the panel, all three words being left reading.

The indicia forming the words "READY" was instantly colored by swabbing over the area with a blue colored dye designated "Sandoz Acetol Blue" and the procedure repeated using a red dye designated "Sandoz Acetosol Scarlet" to impregnate the indicia forming the word "SPENT". The indicia panel was then laminated face down to a 1/32 inch thick translucent polyester panel sheet using a clear double faced polyester heat laminable adhesive tape and the aluminum metal backing member removed using the hydrochloric acid-hydrogen peroxide etching procedure which now forms the completed indicia panel.

A light transmitting panel similar to that utilized in Example 44 was prepared within which several additional sets of blue and red colored miniature tungsten lamps were provided, with electric current being supplied by the electroless nickel pattern which surrounded the non-image or translucent portions of the indicia placed directly in line with the indicia of the indicia forming panel as described also in the previous example.

The above indicia panel was connected to the light transmitting panel by placing a thin bead of a room temperature curing silicon resin adhesive around the periphery of the panel and the two panels held in position being separated by a small air space until the resin had cured. This example works in the same manner as described in Example 44, that is, when the blue colored light is activated the indicia forming the word "READY" in blue will be illuminated in blue light which will not illuminate the indicia forming the word "SPENT" in red since the red dye in this case effectively prohibits the transmission of blue light. When either the red or blue color illuminators are activated the indicia forming the words "NO. 1" will be illuminated.

EXAMPLE 46 (FIG. 22)

An anodized aluminum foil plate 0.005 inch in thickness was utilized as described in Example 45, except the indicia panel as well as the reverse panel and sides were fabricated from a single sheet of anodized aluminum and the lamps soldered into place and a connection pin was provided. The sheet was then folded into a rectangular dimension such that it formed the final shape of the panel desired except for one end. The folded over edge portion, again excepting the one end, were sealed with a double face pressure sensitive adhesive and the entire assembly turned on end and held flat and parallel by a movable mold arrangement support with the open end facing up. The interior of the panel was then filled with a castable allyldiglycolcarbonate resin containing approximately 3 percent by weight isopropyl percarbonate catalyst. Since this casting undergoes 14 percent shrinkage during polymerization, an excess of monomer material is applied to compensate for this amount using the variable mold arrangement. The filled mold was then placed in a hot air oven for 24 hours at 70°C. The supporting mold was then removed and the cast panel was given a post cure treatment of 115°C. for 2 hours which serves to complete the cure, relieve strains and assure dimensional stability of the finished panel. The open ends were then folded over and secured in place with a double faced pressure sensitive adhesive and an external connection made to the enclosed circuit pattern terminals which was then wrapped with a plastic adhesive tape and the panel immersed briefly in a 10 percent aqueous sodium hydroxide solution, rinsed briefly in water, and the entire exterior aluminum metal backing member removed by etching. A completed edge illuminated panel similar to that of Example 45 is obtained. It is evident that the sides and reverse panel need not be etched if a strippable coating is first applied to those areas prior to the etching procedure.

The products described in the preceding description and examples have been indicated to be particularly suited to use in the manufacture of edge lighted panels, for example, panels of the types described in any of the following U.S. Pat. issued to Hardesty: Nos. 2,795,069, 2810,225, 2,821,800, 2,838,865, 2,886,911 and 2,945,313, the disclosures of which are incorporated in this application by reference, and in many other edge lighted panel constructions known in the art.

A related application entitled "Metal Plated Images" was filed in the United States Patent Office On Oct. 22, 1971 in which claims are included to some of the subject matter disclosed in the present application. This application was given Ser. No. 191,635, and issued July 2, 1974 as U.S. Pat. No. 3,822,128.

We claim:

1. In a process for producing an indicia bearing laminated article which comprises:
   providing an anodized member consisting of an aluminum metal base composed of anodizable metal selected from the group consisting of aluminum and aluminum base alloys and an anodized oxide layer on said metal base, said oxide layer consisting of a non-porous thin oxide band adjacent to the metal base and a porous layer of oxide integral with said non-porous layer and producing an image in said porous layer, which image can only be viewed by reflected light; the improvements which comprise:
   applying a clear protective organic material to the surface of said porous layer to bury the image in said pores and to protect the image in said pores and to render said layer self-supporting and chemically removing the metal base from said article whereby the image in said layer can be viewed by diffused light and can be projected by direct illumination.

2. The process of claim 1 wherein the organic material is applied as a clear panel of organic material.

3. The process of claim 1 wherein the base metal is aluminum.

4. The process of claim 1 wherein the step of depositing a metal in the pores is continued after the image bearing pores have been filled to the point that the deposited metal forms a metal bridge between filled pores.

5. The process of claim 1 wherein the image in said porous layer is of a metal selected from the group consisting of silver, gold, palladium and platinum and the metal deposited on said image is selected from the group consisting of nickel, cobalt, iron, copper, chromium, gold, silver, platinum, platinum and mixtures thereof.

6. The process of claim 5 including in addition, the step of depositing a metal in the image-containing pores by electroless deposition before applying said clear organic material to said porous surface.

7. The process of claim 1 including in addition the step of chemically removing the non-porous thin oxide band adjacent to the metal base after the metal base has been removed.

8. The process of claim 1 wherein the image consists of pigment, dye or metal.

9. The process of claim 1 wherein the metal base is removed from the remainder of the article by dissolution of the base.

10. The process of claim 5 wherein the metal is deposited on said metal image by electroless deposition.

11. A process for producing indicia bearing articles which comprises:
    providing an unsealed anodized aluminum metal base consisting of a layer of anodizable metal selected from the group consisting of aluminum and aluminum base alloys and anodically formed oxide layer on said metal, said oxide layer consisting of a non-porous thin oxide band adjacent to the anodizable metal base and integral therewith and a porous layer of oxide integral with said non-porous layer,
    producing a reduced silver image of said indicia in the pores of said porous layer,
    coating and further impregnating the porous oxide layer with a clear organic material,
    thereafter successively chemically removing the anodizable metal base and the thin non-porous oxide band, thereby exposing the reduced silver image in said porous layer,
    and then depositing metal on said reduced silver image by electroless deposition to build up the pattern of said indicia.

12. The process of claim 11 wherein the metal base is anodized aluminum foil, the metal image is silver, and the clear organic material is a resin, and the resin is cured by heating before the aluminum backing is removed.

13. The process of claim 11 wherein the indicia is a printed circuit and the electroless deposited metal is nickel.

* * * * *